United States Patent
Zhang et al.

(10) Patent No.: US 9,967,115 B1
(45) Date of Patent: May 8, 2018

(54) CIRCUITS AND METHODS FOR SPATIAL EQUALIZATION OF IN-BAND SIGNALS IN MIMO RECEIVERS

(71) Applicants: Linxiao Zhang, New York, NY (US); Harish Krishnaswamy, New York, NY (US)

(72) Inventors: Linxiao Zhang, New York, NY (US); Harish Krishnaswamy, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days. days.

(21) Appl. No.: 15/617,828

(22) Filed: Jun. 8, 2017

(51) Int. Cl.
*H04B 7/10* (2017.01)
*H04L 25/03* (2006.01)
*H03D 7/14* (2006.01)
*H03F 3/19* (2006.01)
*H04B 7/0413* (2017.01)

(52) U.S. Cl.
CPC ..... *H04L 25/03891* (2013.01); *H03D 7/1466* (2013.01); *H03F 3/19* (2013.01); *H04B 7/0413* (2013.01); *H03F 2200/294* (2013.01); *H03F 2200/451* (2013.01)

(58) Field of Classification Search
CPC ... H04L 1/06; H04L 27/2647; H04B 27/2647; H04B 1/525; H04B 1/123
USPC ........ 375/347, 348, 267, 340; 455/214, 337; 342/368
See application file for complete search history.

(56) References Cited

U.S. PATENT DOCUMENTS

| | | | |
|---|---|---|---|
| 8,102,907 B2 | 1/2012 | Kim | |
| 2012/0044927 A1* | 2/2012 | Pan | H03M 3/47 370/345 |
| 2012/0154192 A1* | 6/2012 | Op 'T Eynde | H03M 1/0682 341/155 |
| 2015/0311993 A1 | 10/2015 | Yoo et al. | |

FOREIGN PATENT DOCUMENTS

| WO | WO 2017/177421 | 4/2016 |
|---|---|---|
| WO | WO 2017/177757 | 2/2017 |
| WO | WO 2017/180742 | 4/2017 |

OTHER PUBLICATIONS

Alamouti, S., "A Simple Transmit Diversity Technique for Wireless Communications," in IEEE Journal on Selected Areas in Communications, vol. 16, No. 8, Oct. 1998, pp. 1451-1458.

(Continued)

*Primary Examiner* — Khai Tran
(74) *Attorney, Agent, or Firm* — Byrne Poh LLP (57) ABSTRACT

A circuit for spatial equalization, comprising: circuit elements each comprising four variable transconductors, in each of the circuit elements: an input of a first variable transconductor (VT) is connected to an input I and an output of the first VT is connected to an output I; an input of the second VT is connected to an input Q and an output of the second VT is connected to output I; an input of the third VT is connected to input I and an output of the third VT is connected to the output Q; and an input of the fourth VT is connected to input Q and an output of the fourth VT is connected to output Q; the input I of each of the first plurality of circuit elements are connected together; and the input Q of each of the first plurality of circuit elements are connected together.

7 Claims, 5 Drawing Sheets

(56) References Cited

OTHER PUBLICATIONS

Babakhani et al., "A 77-GHz Phased-Array Transceiver with On-Chip Antennas in Silicon: Receiver and Antennas", in IEEE Journal of Solid-State Circuits, vol. 41, No. 12, Dec. 2006, pp. 2795-2806.
Foschini, G., "Layered Space-Time Architecture for Wireless Communication in a Fading Environment When Using Multi-Element Antenas", in Bell Labs Technical Journal, vol. 1, No. 2., Jun. 1996, pp. 41-59.
Fulton et al., "Calibration Techniques for Digital Phased Arrays", In Proceedings of IEEE Int. Conf. Microwaves, Communications, Antennas and Electronics Systems (COMCAS), Tel Aviv, Israel, Nov. 9-11, 2009, pp. 1-10.
Fulton, C.J., "Digital Array Radar Calibration and Performance Monitoring Techniques for Direct Conversion and Dual Polarization Architectures", in Ph.D. Dissertation, Dept. Electr. Eng., Purdue University, Lafayette, IN, USA, Dec. 7, 2011, pp. 1-218.
Ghaffari et al., "Simultaneous Spatial and Frequency Domain Filtering at the Antenna Inputs Acheiving up to +10dBm Out-of-Band/Beam P1 dB", in ISSCC Digest of Technical Papers, Feb. 2013, pp. 84-85.
Guan et al., "A Fully Integrated 24-GHz Eight-Element Phased-Array Receiver in Silicon", in IEEE Journal Solid-Stale Circuits, vol. 39, No. 12, Dec. 2004, pp. 2311-2320.
He, M., "A 40 nm Dual-Band 3-Stream 802.11a/b/g/n/ac MIMO WLAN SoC with 1.1 Gb/s Over-the-Air Throughput", in IEEE International Solid-State Circuits Conference (ISSCC) Digital Technology Papers, Feb. 2014, pp. 350-351.
Jain et al., "A 10 GHz CMOS RX Front End with Spatial Cancellation of Co-Channel Interferers for MIMO/Digital Beamforming Arrays", in Proceedings of IEEE Radio Frequency Integrated Circuits Symposium (RFIC), May 22-24, 2016, pp. 99-102.
Kalia et al., "Multi-Beam Spatio-Spectral Beamforming Receiver for Wideband Phased Arrays", in IEEE Transactions on Circuits and Systems I: Regular Papers, vol. 60, No. 8, Aug. 2013, pp. 2018-2029.
Kim et al., "A 1.3 mW 48 MHz 4 Channel MIMO Baseband Receiver With 65 dB Harmonic Rejection and 48.5 dB Spatial Signal Separation ", in IEEE Journal of Solid-State Circuits, vol. 51, No. 4, Apr. 2016, pp. 832-844.
Klemmer et al., "A 45 nm CMOS RF-to-Bits LTE/WCDMA FDD/TDD 2×2 MIMO Base-Station Transceiver SoC with 200 MHz RF Bandwidth", In Proceedings of IEEE International Solid-State Circuits Conference (ISSCC), San Francisco, CA, US, Jan. 31-Feb. 4, 2016, pp. 164-165.
Koh et al., "An X- and Ku-Band 8-Element Phased-Array Receiver in 0.18-μm SiGe BiCMOS Technology", in IEEE Journal of Solid-State Circuits, vol. 43, No. 6, Jun. 2008, pp. 1360-1371.
Krishnaswamy et al., "Analog and RF Interference Mitigation for Integrated MIMO Receiver Arrays", in Proceedings of the IEEE, vol. 104, No. 3, Mar. 2016, pp. 561-575.
Krishnaswamy et al., "A 4-Channel 24-27 GHz UWB Phased Array Transmitter in 0.13 μm CMOS for Vehicular Radar", In Proceedings of IEEE Custom Integrated Circuits Conference, San Jose, CA, US, Sep. 16-19, 2007, pp. 753-756.
Krishnaswamy et al., "A 4-Channel 4-Beam 24-to-26GHz Spatio-Temporal RAKE Radar Transceiver in 90 nm CMOS for Vehicular Radar Applications", in Proceedings of IEEE International Solid-State Circuits Conference (ISSCC), San Francisco, CA, US, Feb. 7-11, 2010, pp. 214-215.
Krishnaswamy et al., "A Variable-Phase Ring Oscillator and PLL Architecture for Integrated Phased Array Transceivers", In IEEE Journal of Solid-Stale Circuits, vol. 43, No. 11, Nov. 21, 2008, pp. 2446-2463.
Larsson et al., "Massive MIMO for Next Generation Wireless Systems", In IEEE Communications Magazine, vol. 52, No. 2, Apr. 2013, pp. 186-195.

Natarajan et al., "A Fully Integrated 24-GHz Phased-Array Transmitter in CMOS", In IEEE Journal of Solid-State Circuits, vol. 40, No. 12, Dec. 2005, pp. 2502-2514.
Palaskas et al., "A 5-GHz 108-Mb/s 2 × 2 MIMO Transceiver RFIC with Fully Integrated 20.5-dBm P1dB Power Amplifiers in 90-nm CMOS", in IEEE Journal of Solid-State Circuits, vol. 41, No. 12, Dec. 2006, pp. 2746-2756.
Pei et al., "A 30/35 GHz Dual-Band Transmitter for Phased Arrays in Communication/Radar Applications", in IEEE Journal of Solid-State Circuits, vol. 50, No. 7, Jul. 2015, pp. 1629-1644.
Puglielli et al., "Design of Energy- and Cost-Efficient Massive MIMO Arrays", in Proceedings of the IEEE, vol. 104, No. 3, Mar. 2016, pp. 586-606.
Soer et al., "A 1.0-to-2.5GHz Beamforming Receiver iwth Constant-Gm Vector Modulator Consuming <9mW per Antenna Element in 65nm CMOS", in ISSCC Digest of Technical Papers, Feb. 2014, pp. 66-67.
Soer et al., "A 1.0-to-4.0GHz 65nm CMOS Four-Element Beamforming Receiver Using a Switched-Capacitor Vector Modulator with Approximate Sine Weighting via Charge Redistribution", in International Solid-State Circuits Conference Digest of Technical Papers (ISSCC), San Francisco, CA, US, Feb. 20-24, 2011, pp. 64-66.
Tarokh et al., "Space-Time Codes for High Data Rate Wireless Communication: Performance Criterion and Code Construction", In IEEE Transactions on Information Theory, vol. 44, No. 2, Mar. 1988, pp. 744-765.
Tseng et al., "A Four-Channel Beamforming Down-Converter in 90-nm CMOS Utilizing Phase Oversampling", in IEEE Journal on Solid-Stale Circuits, vol. 45, No. 11, Nov. 2010, pp. 2262-2272.
Valdes-Garcia et al., "A Fully Integrated 16-Element Phased-Array Transmitter in SiGe BiCMOS for 60-GHz Communications", in IEEE Journal of Solid-State Circuits, vol. 45, No. 12, Dec. 2010, pp. 2757-2773.
Zhang et al., "A Scalable 0.1-to-1.7GHz Spatio-Spectral-Filtering 4-Element MIMO Receiver Array with Spatial Notch Suppression Enabling Digital Beamforming," in 2016 IEEE International Solid-State Circuits Conference Digest of Technical Papers (ISSCC), Feb. 2016, p. 1-3.
Zhang et al., "Scalable Spatial Notch Suppression in Spatio-Spectral-Filtering MIMO Receiver Arrays for Digital Beamforming", in IEEE Journal of Solid-State Circuits, vol. 51, No. 12, Dec. 2016, pp. 3152-3166.
Zhang et al., "A 0.1-to-3.1GHz 4-Element MIMO Receiver Array Supporting Analog/RF Arbitrary Spatial Filtering," in IEEE International Solid-State Circuits Conference Digest of Technical Papers (ISSCC), Feb. 2017, pp. 1-3.
Chen, S. et al., "Semi-Blind Adaptive Spatial Equalization for MIMO Systems with High-Order QAM Signalling", In IEEE Transactions on Wireless Communications, vol. 7, No. 11, Nov. 2008, pp. 4486-4491.
Razavi, S.M. and Ratnarajah, T., "Interference Alignment in K-User Multiple-Input-Multiple-Output Interference Channels with Partially Coordinated Receivers", In IET Communications. vol. 8, No. 1, Feb. 2014, pp. 50-57.
Wiley, R.W. et al., "Contrast Sensitivity Determined with the Spatial Bandwidth Equalization Technique: Threshold, Suprathreshold, and Spatiotemporal Measurements", In the American Journal of Optometry and Physiological Optics, vol. 61, No. 4, Apr. 1984, pp. 221-231.
Zheng, S. et al., "RF Multiple-Input Multiple-Output Switchless Front-End", In Electronic Letters, vol. 42, No. 24, Nov. 2006, pp. 1408-1410.
Zhou, Z.M. et al., "Spatial and Temporal CM Equalization for Broadband Wireless Indoor Networks at Millimeter Waves", In the International Journal of Infared and Millimeter Waves, vol. 22, No. 2, Feb. 2001, pp. 255-263.

\* cited by examiner

CIRCUITS AND METHODS FOR SPATIAL EQUALIZATION OF IN-BAND SIGNALS IN MIMO RECEIVERS

STATEMENT REGARDING GOVERNMENT FUNDED RESEARCH

This invention was made with government support under the ACT project awarded by DARPA. The government has certain rights in the invention.

BACKGROUND

Multiple-Input-Multiple-Output (MIMO) technology utilizes multiple antennas to achieve a multiplication of spectral efficiency in a wireless communication system. In a receiver array, a coherent summation of signals is carried out to spatially select desired signals with improved a signal-to-noise ratio (SNR). The spatial diversity gain provided also improves link reliability.

In typical MIMO systems, however, RF/analog circuits together with analog-to-digital converters (ADCs) have to handle the complete array aperture information. In the presence of strong spatial signals, high instantaneous dynamic range is required, leading to high power consumption and cost.

Accordingly, new mechanisms for spatial equalization of in-band signals in MIMO receivers are desirable.

SUMMARY

A circuit for spatial equalization of in-band signals, comprising: a first plurality of circuit elements, wherein: each of the first plurality of circuit elements comprising a first variable transconductor, a second variable transconductor, a third variable transconductor, a fourth variable transconductor, an input I, an input Q, an output I, and an output Q; in each of the first plurality of circuit elements: an input of the first variable transconductor is connected to input I and an output of the first variable transconductor is connected to output I; an input of the second variable transconductor is connected to input Q and an output of the second variable transconductor is connected to output I; an input of the third variable transconductor is connected to input I and an output of the third variable transconductor is connected to output Q; and an input of the fourth variable transconductor is connected to input Q and an output of the fourth variable transconductor is connected to output Q; in at least one of the first plurality of circuit elements: a first variable resistor connects the input I to the output I; and a second variable resistor connects the input Q to the output Q; the input I of each of the first plurality of circuit elements are connected together; and the input Q of each of the first plurality of circuit elements are connected together; a second plurality of circuit elements, wherein: each of the second plurality of circuit elements comprising a first variable transconductor, a second variable transconductor, a third variable transconductor, a fourth variable transconductor, an input I, an input Q, an output I, and an output Q; in each of the second plurality of circuit elements: an input of the first variable transconductor is connected to input I and an output of the first variable transconductor is connected to output I; an input of the second variable transconductor is connected to input Q and an output of the second variable transconductor is connected to output I; an input of the third variable transconductor is connected to input I and an output of the third variable transconductor is connected to output Q; and an input of the fourth variable transconductor is connected to input Q and an output of the fourth variable transconductor is connected to output Q; in at least one of the second plurality of circuit elements: a first variable resistor connects the input I to the output I; and a second variable resistor connects the input Q to the output Q; the input I of each of the second plurality of circuit elements are connected together; and the input Q of each of the second plurality of circuit elements are connected together; wherein the output I of a first of the first plurality of circuit elements is connected to the output I of a first of the second plurality of circuit elements; wherein the output I of a second of the first plurality of circuit elements is connected to the output I of a second of the second plurality of circuit elements; wherein the output Q of a first of the first plurality of circuit elements is connected to the output Q of a first of the second plurality of circuit elements; and wherein the output Q of a second of the first plurality of circuit elements is connected to the output Q of a second of the second plurality of circuit elements.

DETAILED DESCRIPTION

Figure 1:
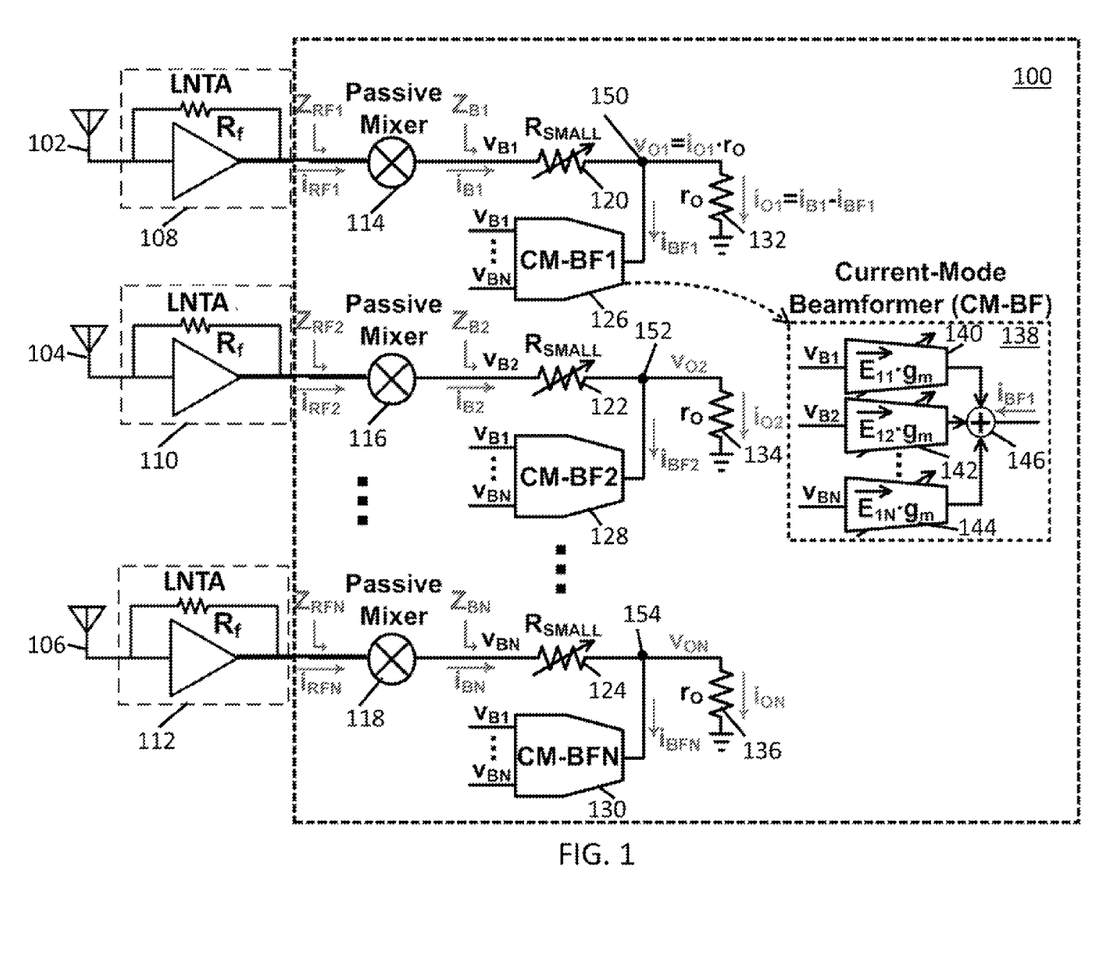
FIG. 1 shows an example of a schematic for a circuit for spatial equalization of in-band signals in multiple-input-multiple-output (MIMO) receivers in accordance with some embodiments.

Turning to FIG. 1, an example 100 of a circuit for spatial equalization of in-band signals in multiple-input-multiple-output (MIMO) receivers in accordance with some embodiments is illustrated. As shown, circuit 100 includes N passive mixers 114, 116, and 118, N variable resistors $R_{SMALL}$ 120, 122, and 124, N current-mode beamformers 126, 128, and 130, and N output resistors $r_O$ 132, 134, and 136. As also shown, the passive mixers can be driven by N antennas 102, 104, and 106 and N low-noise transconductance amplifiers (LNTAs) 108, 110, and 112, in some embodiments.

Figure 3:
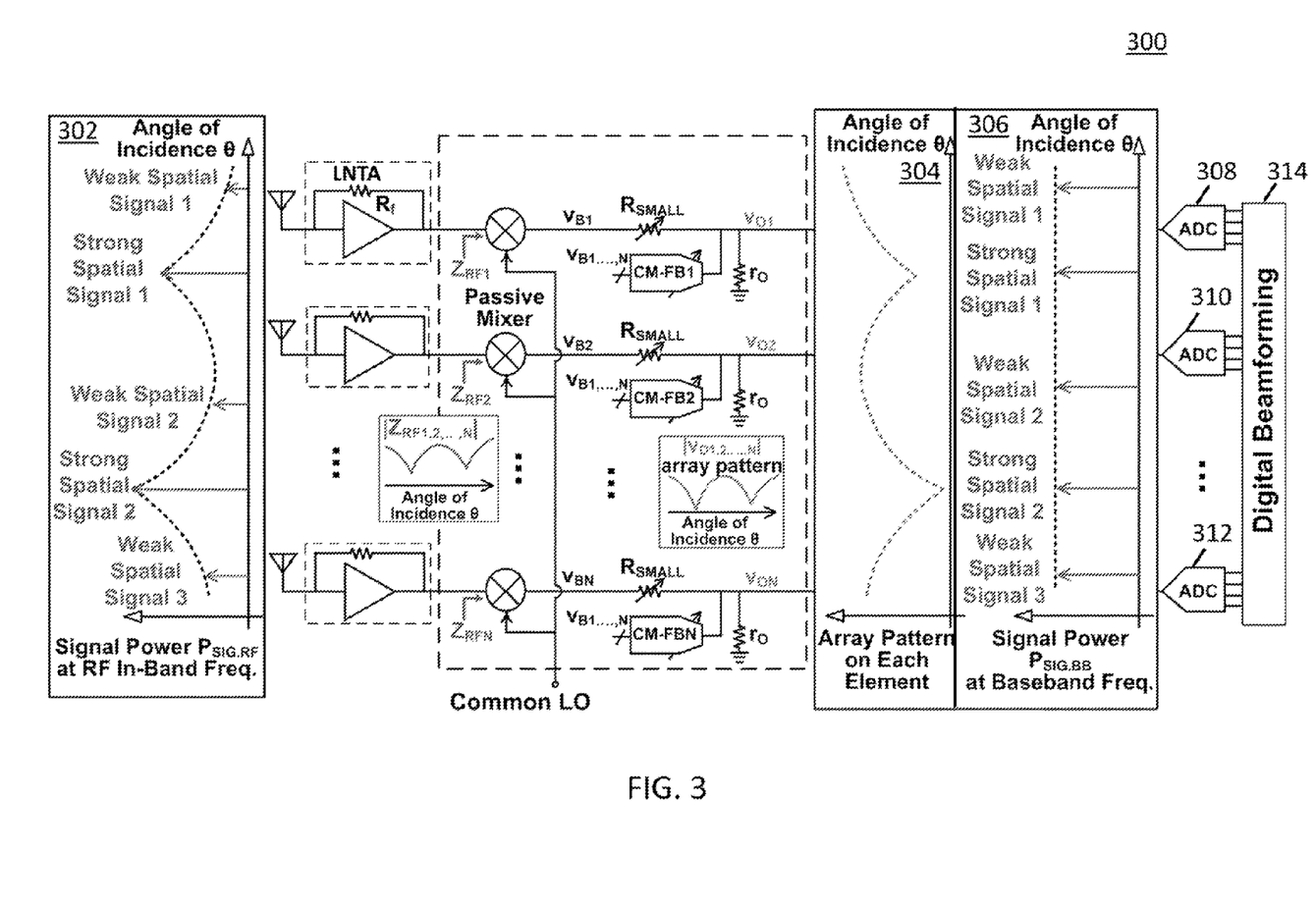
FIG. 3 shows an example of how received signals are processed using a circuit like that of FIG. 1 in accordance with some embodiments.

N passive mixers 114, 116, and 118 can be any suitable current-mode passive mixers and any suitable number N of passive mixers can be used in some embodiments. As shown in FIG. 3, each of the passive mixers can be connected to a common local oscillator (LO) in some embodiments.

N variable resistors $R_{SMALL}$ 120, 122, and 124 can be any suitable variable resistors, can have any suitable range of values, and any suitable number N of variable resistors can be used in some embodiments.

N current-mode beamformers 126, 128, and 130 can be any suitable current-mode beamformers, and any suitable number N of current-mode beamformers can be used in some embodiments. In some embodiments, the current-mode beamformers (CM-BFs) can be implemented as CM-BF 138 in FIG. 1. As shown, the CM-BFs can each be implements using N variable transconuctance amplifiers 140, 142, and 144 having outputs that are connect to the output of the CM-BF at a node 146.

N output resistors $r_O$ 132, 134, and 136 can be any suitable output resistors, can have any suitable values, and any suitable number N of resistors can be used in some embodiments.

During operation, the N low-noise transconductance amplifiers (LNTAs) convert the signal voltages sensed by the antennas (which can have $\lambda_{LO}/2$ spacing (where $\lambda_{LO}$ corresponds to the wavelength in free space at the local oscillator (LO) frequency)) to N signal currents, $i_{RF1, 2, \ldots, N}$, and drive them into the passive mixers, in which these signal currents are downconverted to baseband currents, $i_{B1, 2, \ldots, N}$.

To synthesize a desired spatial response, the current-mode beamformers (CM-BFs) sense voltages $v_{B1, 2, \ldots, N}$ and form beams in the current domain, $i_{BF1, 2, \ldots, N}$.

Because of currents $i_{B1, 2, \ldots, N}$ and $i_{BF1, 2, \ldots, N}$, the output voltages across the N output resistors $r_O$ are:

$$v_{O1,2,\ldots,N} = (i_{B1,2,\ldots,N} - i_{BF1,2,\ldots,N}) \cdot r_O \quad (1)$$

While $i_{B1, 2, \ldots, N}$ and $r_O$ are angle-independent, the spatial responses of $i_{BF1, 2, \ldots, N}$ can be suitably synthesized by the CM-BFs, and, as shown in equation (1), the resultant spatial responses of $v_{O1, 2, \ldots, N}$ are proportional to the differences between $i_{B1, 2, \ldots, N}$ and $i_{BF1, 2, \ldots, N}$.

In the directions of strong signals, beams can be formed in the current domain to exactly match $i_{B1, 2, \ldots, N}$, leaving output nodes 150, 152, and 154 virtual grounds for the strong signals, or equivalently leading to almost perfect rejection. In the directions of weak signals, notches can be formed in the current domain to null out $i_{BF1, 2, \ldots, N}$, allowing large output voltage swings ($i_{B1, 2, \ldots, N} \cdot r_O$) at nodes 150, 152, and 154. Flexible CM-BFs with both phase and gain controls allow the independent steering of one or multiple beams/nulls to any suitable directions. If a certain value of rejection ratio is desired, $i_{BF1, 2, \ldots, N}$ can also be synthesized to be a certain proportion of $i_{B1, 2, \ldots, N}$, therefore allowing the flexible adjustment of notch depths for $v_{O1, 2, \ldots, N}$ as well.

Since $v_{O1, 2, \ldots, N}$ are given by equation (1), the baseband voltages $v_{B1, 2, \ldots, N}$ can be easily found by:

$$v_{B1,2,\ldots,N} = v_{O1,2,\ldots,N} + i_{B1,2,\ldots,N} \cdot R_{SMALL} \quad (2)$$

$$= (i_{B1,2,\ldots,N} - i_{BF1,2,\ldots,N}) \cdot r_O + i_{B1,2,\ldots,N} \cdot R_{SMALL}$$

And the input impedances, $Z_{B1, 2, \ldots, N}$, can be defined to be:

$$Z_{B1,2,\ldots,N} = v_{B1,2,\ldots,N} / i_{B1,2,\ldots,N} \quad (3)$$

$$= R_{SMALL} + r_O \cdot (1 - i_{BF1,2,\ldots,N} / i_{B1,2,\ldots,N})$$

Equation (3) shows that, in the directions of strong signals, $i_{B1, 2, \ldots, N} = i_{BF1, 2, \ldots, N}$ leads to virtual grounds at output nodes 150, 152, and 154, causing low input impedance $Z_{B1, 2, \ldots, N} = R_{SMALL}$. In the directions of weak signals, $i_{BF1, 2, \ldots, N} = 0$ leads to high input impedance $Z_{B1, 2, \ldots, N} = R_{SMALL} + r_O$. In fact, the spatial response of the input impedances will follow that of the output voltages, except for a non-zero offset of $R_{SMALL}$. This offset is provided so that non-zero strong spatial signal voltages can form and be sensed by the CM-BFs.

Input impedances $Z_{B1, 2, \ldots, N}$ can be translated to RF by the passive mixers. This is because low pass filtering impedances at the baseband ports of the mixers result in band pass filtering input impedance profiles, centered around the mixer switching frequency, at the RF ports of the mixers.

Figure 2:
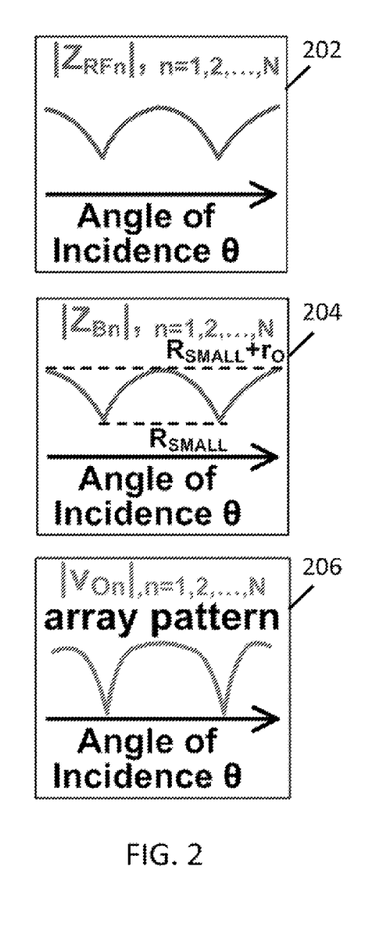
FIG. 2 shows examples of graphs showing impedance values and output voltages of a circuit like that of FIG. 1 in accordance with some embodiments.

Turning to FIG. 2, example graphs 202, 204, and 206 showing values of $|Z_{RF1, 2, \ldots, N}|$, $|Z_{B1, 2, \ldots, N}|$, and $|v_{O1, 2, \ldots, N}|$, respectively, over angles of incidence $\theta$ in accordance with some embodiments are illustrated. As shown in graph 204, the value of $|Z_{B1, 2, \ldots, N}|$ varies between the values of $R_{SMALL} + r$ and $R_{SMALL}$ based on the angle of incidence $\theta$.

FIG. 3 shows an example illustration 300 of weak and strong spatial signals 302 being present at the antennas of a MIMO receiver over a variety of angles of incidence $\theta$, an array pattern 304 formed by $v_{O1, 2, \ldots, N}$, and resulting signal powers at baseband frequency 306 for the weak and strong spatial signals at the inputs to analog-to-digital converters (ADCs) 308, 310, and 312 connected to $v_{O1, 2, \ldots, N}$. As also shown in FIG. 3, a digital beamforming mechanism 314 can be provided at the outputs of the ADCs.

The CM-BF output current $i_{BFn}$ shown in FIG. 1 on the nth path can be written as:

$$i_{BFn} = g_m \Sigma_{k=1}^{N} (\vec{E}_{nk} \cdot v_{Bk}), \quad (4)$$

where $\vec{E}_{nk}$ is a complex weighting factor from the $k^{th}$ input to the $n^{th}$ output. The mathematical method for generating the complex weighting factors $\vec{E}_{nk}$ can be performed as described in Allen, B. et al., "Adaptive Array Systems Fundamentals and Applications," John Wiley & Sons Ltd., 2005, chapter 4., which is hereby incorporated by references herein in its entirety.

And according to equation (3), the baseband current $i_{Bn}$ on the nth path in the notch direction is given by:

$$i_{Bn} = v_{Bn,notch} / R_{SMALL} \quad (5)$$

Equations (4) and (5) together with equation (1) lead to:

$$v_{On,notch} = v_{Bn,notch} \cdot r_O \cdot \left( \frac{1}{R_{SMALL}} - g_m \cdot \sum_{k=1}^{N} \left( \vec{E}_{nk} \cdot \frac{v_{Bk,notch}}{v_{Bn,notch}} \right) \right) \quad (6)$$

Matching among elements indicates that $v_{Bk,notch}/v_{Bn,notch}$ is frequency-independent. If both $g_m$ and $\vec{E}_{nk}$ can be implemented in a frequency-independent fashion, $v_{On,notch}$ can be made equal to zero over infinite bandwidth. $\vec{E}_{nk}$ can be implemented to be frequency-independent, and $g_m$ can be implemented to be largely frequency-independent, due to the voltage-to-current conversion within CMOS device, which is intrinsically frequency-independent as long as there is no reactance, such as gate-to-drain capacitance, in parallel with it.

Figure 4:
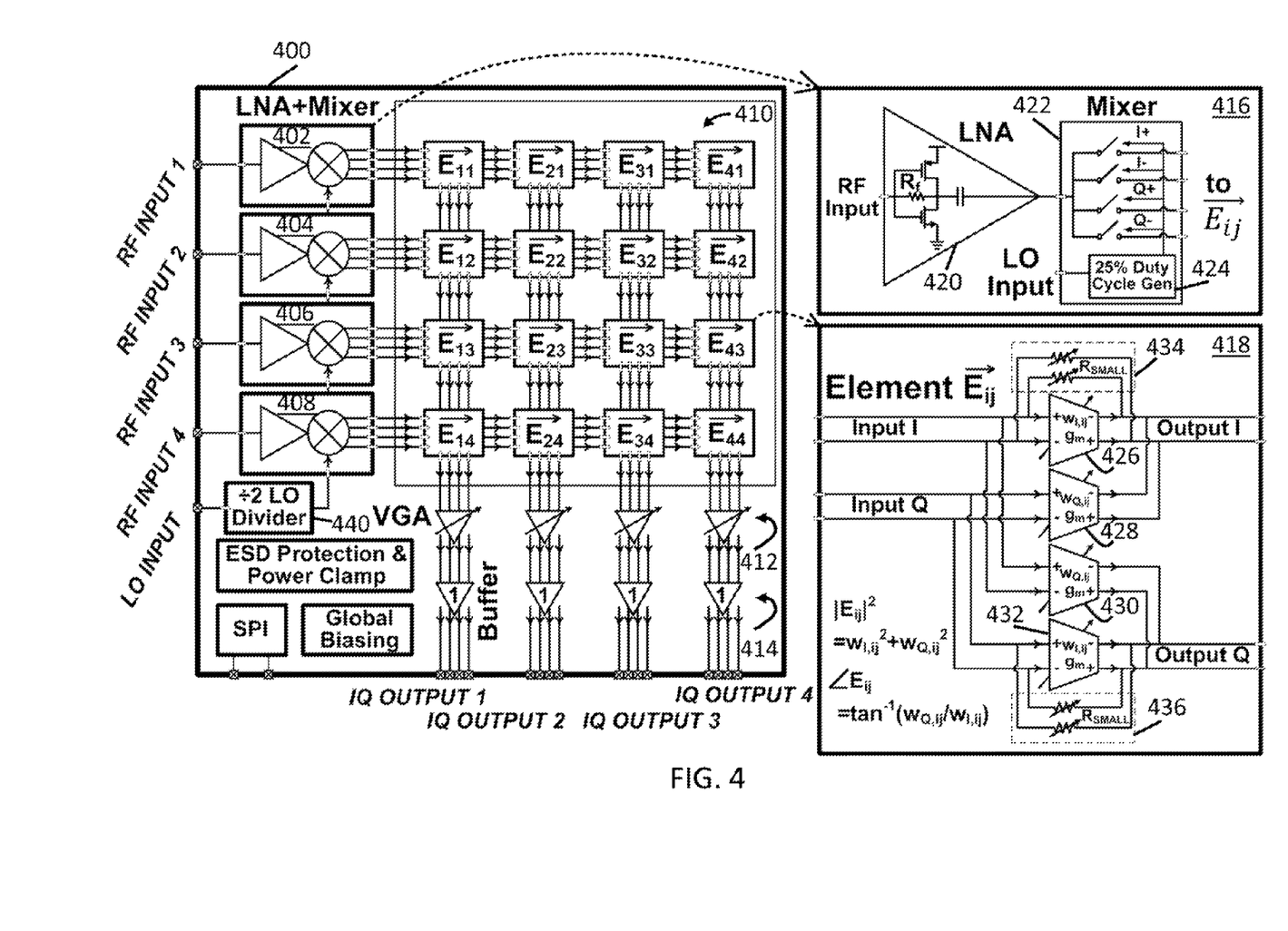
FIG. 4 shows an example of a schematic for an integrated circuit for spatial equalization of in-band signals in multiple-input-multiple-output (MIMO) receivers in accordance with some embodiments.

Turning to FIG. 4, an example 400 of an integrated circuit (IC) incorporating a circuit for spatial equalization of in-band signals in multiple-input-multiple-output (MIMO) receivers in accordance with some embodiments is illustrated. IC 400 can be implemented in any suitable technology, such as 65 nm CMOS process, in some embodiments.

As shown, IC 400 includes four LNA and mixer circuits 402, 404, 406, and 408, sixteen elements $\vec{E}_{ij}$ 410, four variable gain amplifiers 412, and four buffers 414.

Each of RF inputs 1-4 in the figure can come from any suitable source, such as a different antenna of a MIMO device. IQ outputs 1-4 can be provided to any suitable devices, such as analog-to-digital converters that convert analog signals from IC 400 to digital signals prior to those signals being provided to a digital beamforming circuit.

In the illustration of IC 400, the inputs to each element $\vec{E}_{ij}$ (i.e., the arrows on the left of each element) in each row are connected in parallel to the output of the LNA+Mixer in the same row, and the outputs of each element $\vec{E}_{ij}$ (i.e., the arrows on the bottom of each element) in each column are connected in parallel to the inputs to the VGA in the same column.

LNA and mixer circuits 402, 404, 406, and 408 can be implemented in any suitable manner, and any suitable number of these circuits can be provided, in some embodiments. For example, the circuits can each be implemented using LNA and mixer circuits 416 in some embodiments.

As shown, each LNA and mixer circuit 416 can include a low noise amplifier (LNA) 420 and a mixer 422. Any suitable low noise amplifier can be used as LNA 420, and any suitable mixer can be used as mixer 422. For example, in some embodiments, LNA 420 can be implemented using an inverter-based low noise transconductance amplifier (LNTA) using resistive feedback $R_f$. As another example, in some embodiments, mixer 422 can be implemented using four single-balanced I/Q passive mixers that are each implemented using a switch that is driven by one of four 25% duty cycle LOs.

In some embodiments, a differential clock signal at twice the local oscillator (LO) frequency can be generated off-chip. A clock frequency divide-by-two divider 440 can be implemented on-chip to provide a 4-phase LO signal at the desired frequency, which is distributed to the mixers 422. Within each mixer, a digital duty cycle generator 424 reduces the LO signal duty cycle from 50% to slightly less than 25% to ensure non-overlapping switching of the mixer switches. At the mixer output nodes, large shunt metal-insulator-metal (MIM) capacitors (not shown) can be provided to filter out out-of-band signals.

Elements $\vec{E}_{ij}$ 410 provide the functions of the current-mode beamformers and the resistors $R_{SMALL}$ and $r_O$ of FIGS. 1 and 3. These elements can be implemented in any suitable manner, and any suitable number of the elements can be provided, in some embodiments. For example, elements $\vec{E}_{ij}$ 410 can each be implemented using example element 418 in some embodiments.

As shown, each element 418 can include four variable transconductors 426, 428, 430, and 432 and variable resistors $R_{SMALL}$ 434 and 436 (but only when i=j; that is for $\vec{E}_{11}$, $\vec{E}_{22}$, $\vec{E}_{33}$, and $\vec{E}_{44}$). As is described below in connection with FIG. 5, variable transconductors 426, 428, 430, and 432 provide the functions of the current mode beamformers and the resistors $r_O$.

Variable gain amplifiers 412 can be implemented in any suitable manner, and any suitable number of the variable gain amplifiers can be provided, in some embodiments.

Buffers 414 can be implemented in any suitable manner, and any suitable number of the buffers can be provided, in some embodiments. For example, the buffers can be 50 ohm buffers.

During operation, the $E_{ti}$ element senses the baseband voltage on the $j^{th}$ element and converts it to a current on the $i^{th}$ output with a complex gain of $\vec{E}_{ij}$. In the four elements where i=j, small resistors $R_{SMALL}$ are inserted in parallel to achieve input impedance modulation.

Within the $\vec{E}_{ij}$ element, the complex gain $\vec{E}_{ij}$ is achieved by weighting the I-path $g_m$ cells 426 and 428 and the Q-path $g_m$ cells 430 and 432 differently. That is, as shown in FIG. 4, cell 426 is assigned weight $w_{I,ij}$, cell 428 is assigned weight $w_{Q,ij}$, cell 430 is assigned weight $w_{Q,ij}$, and cell 432 is assigned weight $w_{I,ij}$. The currents at the outputs of cells 426 and 428 are combined to provide Output I, and the currents at the outputs of cells 430 and 432 are combined to provide Output Q.

The phase shift achieved on Output I is given by:

$$\angle \vec{E}_{ij} = \tan^{-1}\left(\frac{w_{Q,ij}}{w_{I,ij}}\right) \tag{7}$$

At the same time, the magnitude control of $\vec{E}_{ij}$ is also embedded, as given by:

$$|\vec{E}_{ij}|g_m \cdot \sqrt{w_{Q,ij}^2 + w_{I,ij}^2} \tag{8}$$

Figure 5:
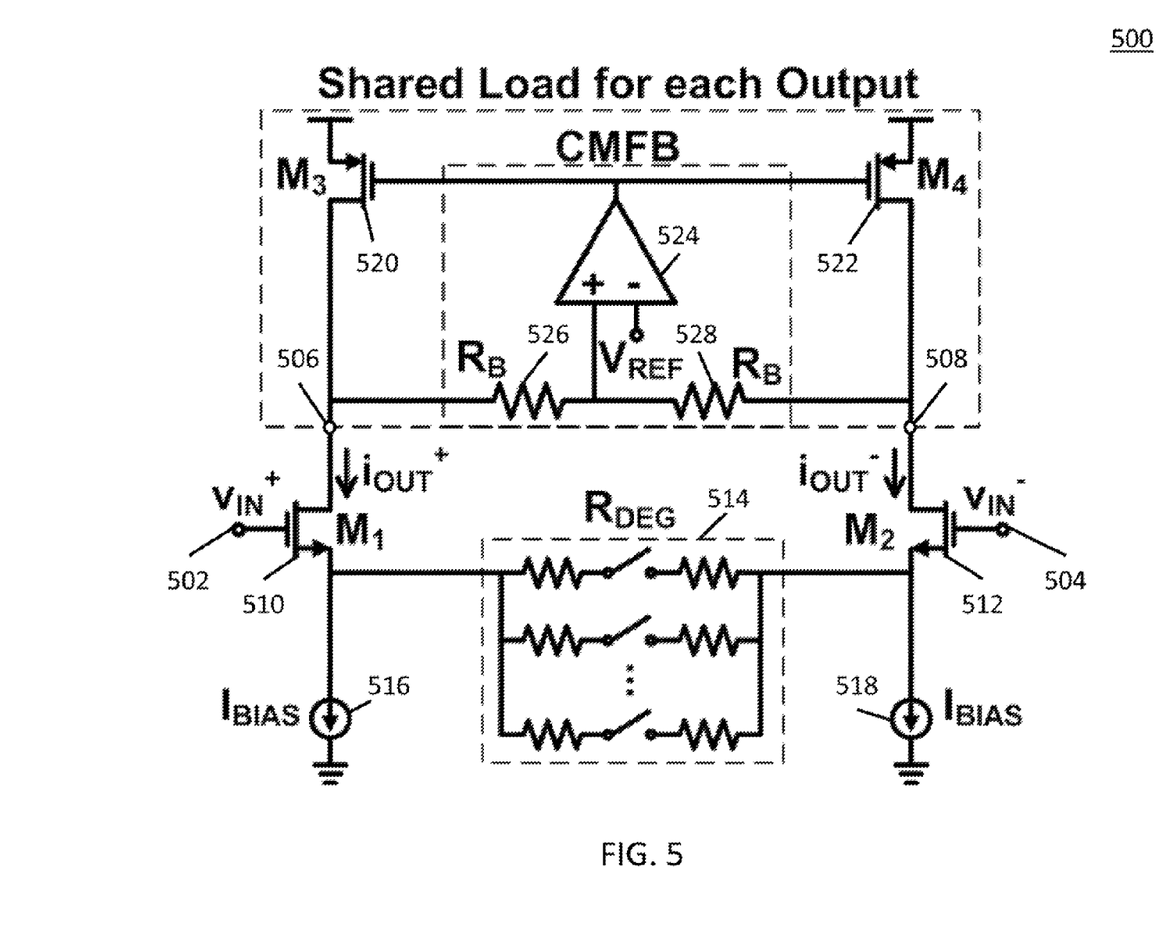
FIG. 5 is an example of a schematic of a circuit for a transconductance cell incorporating an active load with current-mode beamformer in accordance with some embodiments.

An example 500 of a $g_m$ cell that can be used for $g_m$ cells 426, 428, 430, and 432 in accordance with some embodiments is shown in FIG. 5. The inputs to the cell are at nodes 502 and 504, and the outputs are at nodes 506 and 508.

As shown in FIG. 5, each $g_m$ cell 500 includes an nMOS differential pair formed by transistors 510 and 512 with tunable resistive degeneration resistor $R_{DEG}$ 514, and bias current sources 516 and 518. The tunable resistive degeneration resistor is used to apply the $w_I$ and $w_Q$ weighting, and it is controlled by an external controller controlling which of its switches are closed.

As also shown in FIG. 5, cell 500 includes a shared active load with current-mode beamformer that is connected to output nodes 506 and 508. The shared active load with current-mode beamformer includes a pair of pMOS transistors 520 and 522, an operational amplifier 524, and bias resistors 526 and 528. The pMOS transistors, in parallel with the pMOS transistors of other circuits 500 connected to the same I or Q output, act as resistor $r_O$.

The mathematical method for generating the complex weightings for the 16 elements 410 (FIG. 4) can be performed as described in Allen, B. et al., "Adaptive Array Systems Fundamentals and Applications," John Wiley & Sons Ltd., 2005, chapter 4., which is hereby incorporated by references herein in its entirety.

Although the invention has been described and illustrated in the foregoing illustrative embodiments, it is understood that the present disclosure has been made only by way of example, and that numerous changes in the details of embodiment of the invention can be made without departing from the spirit and scope of the invention, which is limited only by the claims that follow. Features of the disclosed embodiments can be combined and rearranged in various ways.

What is claimed is:
1. A circuit for spatial equalization of in-band signals, comprising:
 a first plurality of circuit elements, wherein:
  each of the first plurality of circuit elements comprising a first variable transconductor, a second variable transconductor, a third variable transconductor, a fourth variable transconductor, an input I, an input Q, an output I, and an output Q;
in each of the first plurality of circuit elements:
an input of the first variable transconductor is connected to input I and an output of the first variable transconductor is connected to output I;
an input of the second variable transconductor is connected to input Q and an output of the second variable transconductor is connected to output I;
an input of the third variable transconductor is connected to input I and an output of the third variable transconductor is connected to output Q; and
an input of the fourth variable transconductor is connected to input Q and an output of the fourth variable transconductor is connected to output Q;
in at least one of the first plurality of circuit elements:
a first variable resistor connects the input I to the output I; and
a second variable resistor connects the input Q to the output Q;
the input I of each of the first plurality of circuit elements are connected together; and
the input Q of each of the first plurality of circuit elements are connected together;
a second plurality of circuit elements, wherein:
each of the second plurality of circuit elements comprising a first variable transconductor, a second variable transconductor, a third variable transconductor, a fourth variable transconductor, an input I, an input Q, an output I, and an output Q;
in each of the second plurality of circuit elements:
an input of the first variable transconductor is connected to input I and an output of the first variable transconductor is connected to output I;
an input of the second variable transconductor is connected to input Q and an output of the second variable transconductor is connected to output I;
an input of the third variable transconductor is connected to input I and an output of the third variable transconductor is connected to output Q; and
an input of the fourth variable transconductor is connected to input Q and an output of the fourth variable transconductor is connected to output Q;
in at least one of the second plurality of circuit elements:
a first variable resistor connects the input I to the output I; and
a second variable resistor connects the input Q to the output Q;
the input I of each of the second plurality of circuit elements are connected together; and
the input Q of each of the second plurality of circuit elements are connected together;

wherein the output I of a first of the first plurality of circuit elements is connected to the output I of a first of the second plurality of circuit elements;
wherein the output I of a second of the first plurality of circuit elements is connected to the output I of a second of the second plurality of circuit elements;
wherein the output Q of a first of the first plurality of circuit elements is connected to the output Q of a first of the second plurality of circuit elements; and
wherein the output Q of a second of the first plurality of circuit elements is connected to the output Q of a second of the second plurality of circuit elements.

2. The circuit of claim 1, further comprising:
a first mixer connected to the input I of each of the first plurality of circuit elements; and
a second mixer connected to the input I of each of the second plurality of circuit elements.

3. The circuit of claim 2, wherein:
the first mixer is also connected to the input Q of each of the first plurality of circuit elements; and
the second mixer is also connected to the input Q of each of the second plurality of circuit elements.

4. The circuit of claim 2, further comprising:
a first low noise amplifier having an input coupled to a first radio frequency signal and an output connected to an input of the first mixer; and
a second low noise amplifier having an input coupled to a second radio frequency signal and an output connected to an input of the second mixer.

5. The circuit of claim 1, further comprising:
a first variable gain amplifier having a first input connected to the output I of the first of the first plurality of circuit elements and to the output I of the first of the second plurality of circuit elements; and
a second variable gain amplifier having a first input connected to the output I of the second of the first plurality of circuit elements and to the output I of the second of the second plurality of circuit elements.

6. The circuit of claim 5, wherein:
the first variable gain amplifier also has a second input connected to the output Q of the first of the first plurality of circuit elements and to the output Q of the first of the second plurality of circuit elements; and
a second variable gain amplifier also has a second input connected to the output Q of a second of the first plurality of circuit elements and to the output I of the second of the second plurality of circuit elements.

7. The circuit of claim 1, wherein at the first variable transconductor comprises:
a transistor having a gate connected to the input of the first variable transconductor, a drain connected to the output of the first variable transconductor, and a source;
a tunable resistor having a first side connected to the source of the transistor; and
a current source connected to the source of the transistor.

* * * * *